United States Patent
Das Sharma et al.

(10) Patent No.: US 9,383,932 B2
(45) Date of Patent: Jul. 5, 2016

(54) DATA COHERENCY MODEL AND PROTOCOL AT CLUSTER LEVEL

(71) Applicant: INTEL CORPORATION, Santa Clara, CA (US)

(72) Inventors: Debendra Das Sharma, Saratoga, CA (US); Mohan J. Kumar, Aloha, OR (US); Balint T. Fleischer, Groton, MA (US)

(73) Assignee: Intel Corporation, Santa Clara, CA (US)

( * ) Notice: Subject to any disclaimer, the term of this patent is extended or adjusted under 35 U.S.C. 154(b) by 165 days.

(21) Appl. No.: 14/142,733

(22) Filed: Dec. 27, 2013

(65) Prior Publication Data

US 2015/0186057 A1 Jul. 2, 2015

(51) Int. Cl.
| | | |
|---|---|---|
| *G06F 11/00* | (2006.01) | |
| *G06F 3/06* | (2006.01) | |
| *G06F 11/20* | (2006.01) | |
| *G06F 13/32* | (2006.01) | |

(52) U.S. Cl.
CPC ............ *G06F 3/0619* (2013.01); *G06F 3/0661* (2013.01); *G06F 3/0688* (2013.01); *G06F 11/2017* (2013.01); *G06F 13/32* (2013.01)

(58) Field of Classification Search
USPC .......................................................... 714/6.1
See application file for complete search history.

(56) References Cited

U.S. PATENT DOCUMENTS

| | | | | |
|---|---|---|---|---|
| 5,245,703 A | * | 9/1993 | Hubert | G06F 13/385 703/25 |
| 2001/0052054 A1 | * | 12/2001 | Franke | G06F 12/1458 711/147 |
| 2003/0149844 A1 | * | 8/2003 | Duncan | G06F 12/0817 711/141 |
| 2005/0021906 A1 | * | 1/2005 | Nakamura | G06F 11/1666 711/113 |
| 2005/0223265 A1 | * | 10/2005 | MacLaren | G11C 29/08 714/5.11 |
| 2006/0195721 A1 | * | 8/2006 | Moyer | G06F 11/3648 714/30 |
| 2009/0240869 A1 | * | 9/2009 | O'Krafka | G06F 12/0284 711/103 |
| 2010/0318843 A1 | * | 12/2010 | Singh | G11C 29/4401 714/6.12 |
| 2013/0117600 A1 | * | 5/2013 | Eleftheriou | G06F 11/1068 714/1 |
| 2014/0281243 A1 | * | 9/2014 | Shalf | G06F 12/0813 711/122 |
| 2015/0012504 A1 | * | 1/2015 | Akirav | G06F 17/30156 707/692 |
| 2015/0095705 A1 | * | 4/2015 | Raj | G06F 11/0772 714/34 |

* cited by examiner

*Primary Examiner* — Sarai Butler
(74) *Attorney, Agent, or Firm* — International IP Law Group, P.L.L.C.

(57) ABSTRACT

An apparatus for providing data coherency is described herein. The apparatus includes a global persistent memory. The global persistent memory is accessed using a protocol that includes input/output (I/O) semantics and memory semantics. The apparatus also includes a reflected memory region. The reflected memory region is a portion of the global persistent memory, and each node of a plurality of nodes maps the reflected memory region into a space that is not cacheable. Further, the apparatus includes a semaphore memory. The semaphore memory provides a hardware assist for enforced data coherency.

26 Claims, 3 Drawing Sheets

300

DATA COHERENCY MODEL AND PROTOCOL AT CLUSTER LEVEL

TECHNICAL FIELD

This disclosure relates generally to a multi-node system. More specifically, the disclosure relates to sharing memory.

BACKGROUND ART

A multi-node system may include a plurality of nodes where memory can be shared across various nodes. In some cases, the nodes are connected such that they can be viewed as a single system. The system may be referred to as a cluster, and includes, but is not limited to, a network or rack server system, and the like. The nodes of the cluster may be connected such that memory may be shared between the nodes. However, a failure in one node may cause the entire cluster to fail. Further, memory is accessed across various nodes within the cluster by passing messages through an input/output (I/O) driver.

BRIEF DESCRIPTION OF THE DRAWINGS

The following detailed description may be better understood by referencing the accompanying drawings, which contain specific examples of numerous objects and features of the disclosed subject matter.

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
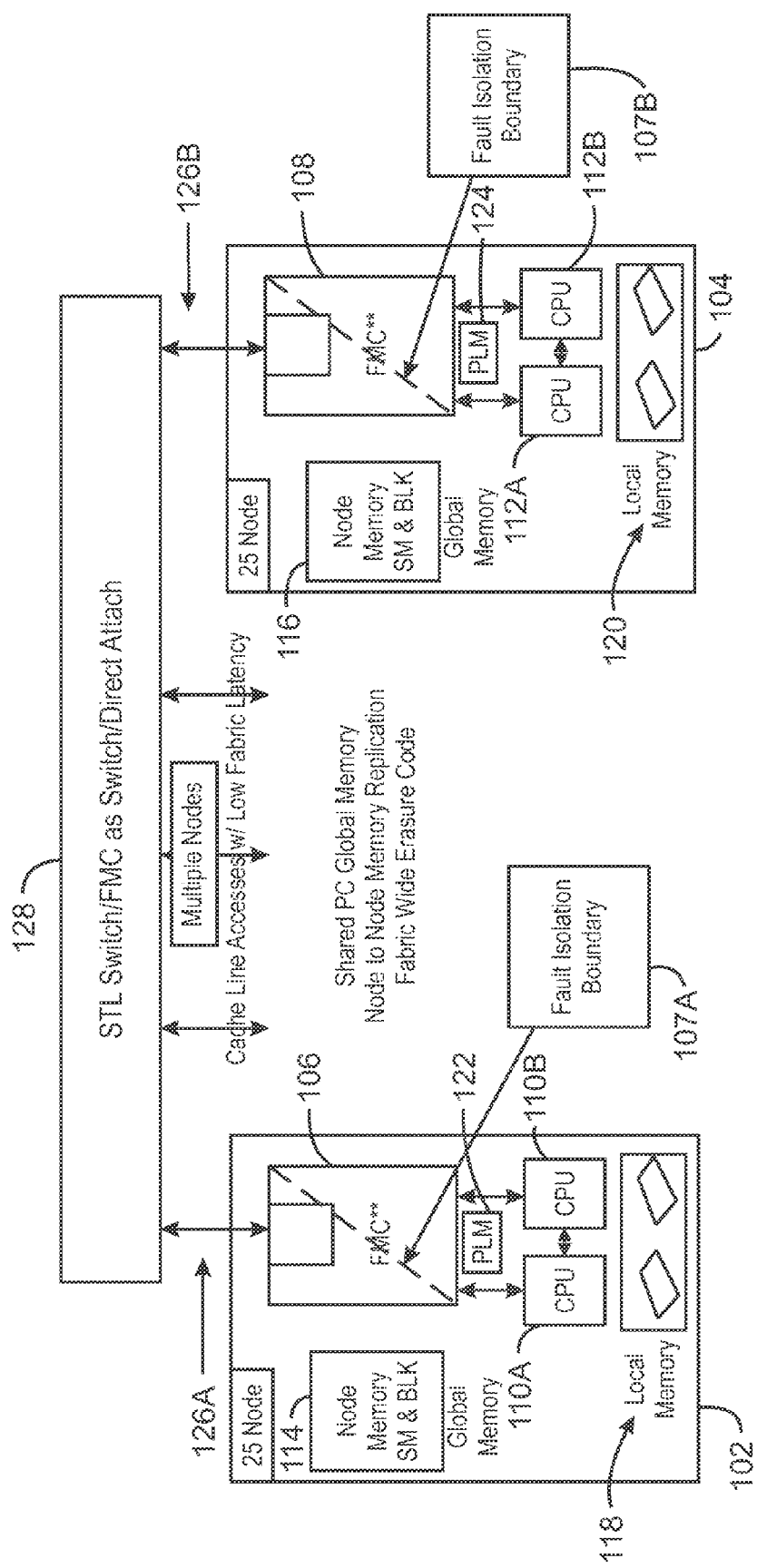
FIG. 1 is an illustration of an architecture that ensures data consistency.

Computing clusters can be implemented using several configurations or architectures. In some cases, the nodes of the cluster are connected using a local area network (LAN). Middleware may be used to coordinate activities between each node. In order to share data, software such as an I/O stack is used to pass messages and data between each node of the cluster. There can be a high latency associated with message passing through an I/O stack. Furthermore, data may not be consistent between nodes, as the higher latency may prevent each node from accessing the latest data. Additionally, the costs associated with maintaining such a cluster may be high, as each node is managed individually.

Embodiments described herein relate to a data consistency model and protocol at cluster level. In embodiments, a global persistent memory, a reflected memory region, and a semaphore memory region are provided. The global persistent memory is accessed using a protocol that includes input/output (I/O) semantics and memory semantics. The reflected memory region is a portion of the global persistent memory, and each node of a plurality of nodes maps the reflected memory region into a space that is not cacheable. Further, the semaphore memory provides a hardware assist for enforced data coherency. Though various memory regions, a data coherency is enabled where the cluster of nodes is connected via a low latency fabric that supports memory load store semantics and provides a hardware assist for data coherency. The low latency load store mechanism may be used by nodes of the cluster to pass information between the nodes. Such low latency passing ensures that the shared data remains consistent between the nodes of each cluster.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM), random access memory (RAM), magnetic disk storage media, optical storage media, flash memory devices, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

FIG. 1 is an illustration of an architecture that ensures data consistency. The partially coherent system 100 includes a node 102 and a node 104. The node 102 includes a fabric memory controller (FMC) 106, and the node 104 includes an FMC 108. Additionally, the node 102 includes a node memory 114 and a local memory 118. The node 104 includes a node memory 116 and a local memory 120. Each FMC 106 and 108 may be a discrete component with their respective node as illustrated in FIG. 1. In some embodiments, the FMCs 106 and 108 may be integrated into the CPU(s) within each node of the multi-node system. Accordingly, in some embodiments the FMC 106 may be integrated into the CPU 110A and the CPU 110B of the node 102, and the FMC 108 may be integrated into the CPU 112A and the CPU 112B of the node 104. The CPUs 110A, 110B, 112A, and 112B each access a global memory using a PLM (Plattsmouth) protocol which is a combination of memory semantics (for the system memory map) similar to SMI3 and the I/O protocol (such as PCIe) for block-type memory access. The global memory includes the node memory 114 and the node memory 116. In embodiments, the global memory may be accessed as a shared memory or a block memory. The global memory may be divided into multiple regions. Specifically, the global memory includes a reflected memory region and a semaphore memory region.

The FMC 106 and the FMC 108 implement a fault isolation boundary 107A and a fault isolation boundary 107B, respectively, where the global memory can be accessed by other nodes even when its local node is down. The FMC supports memory replication (including various forms of RAIDs) across other FMCs and also provide ability to reconstruct the contents of the replicated memory if an FMC (or its associated global memory) goes down.

A Plattsmouth (PLM) Link may be used to connect each CPU to the FMC. Accordingly, the node 102 includes a pair of PLM links 122 to connect the CPU 110A and the CPU 110B to the FMC 106. Similarly, the node 104 includes a pair of PLM links 124 to connect the CPU 112A and the CPU 112B to the FMC 108. A PLM link 126A and a PLM link 126B may also be used to connect the node 102 and the node 104, respectively, to switch 128. Each PLM link is capable of supporting both memory semantics with optional directory information such as SMI3 and an I/O protocol with load and store functionality, such as a Peripheral Component Interconnect Express (PCIe) protocol. In embodiments, any link that can support memory semantics and an I/O protocol using a common set of pins can be used to connect a node to an SMC. Moreover, any link that can support memory semantics and an I/O protocol using a common set of pins can be used to connect a CPU to an FMC. Additionally, the PLM links may be implemented using the physical layer of the PCIe architecture.

The global memory may the accessed via the switch 128. The switch 128 may be used to connect multiple FMCs from a plurality of nodes within a multiple node system. In some cases, the switch 128 may be a Stormlake (STL) switch, another FMC used as a switch, or a direct attach mechanism. In some cases, a back-up switch is included. The switch 128 may be used to route requests for global data between the one or more nodes. In any event, the switch 128 is used to pass low latency message semantics across the global memory. In embodiments, the multiple FMCs are connected to each other either directly using PLM Links or through another FMC switch. Moreover, in embodiments multiple FMCs may be connected by tunneling the PLM protocol over a networking stack like STL through an STL switch.

As a result of the FMCs connecting a plurality of nodes, the global memory is shared and can be accessed via load store semantics. For computations local to a node, the node may access its own reserved memory for those computations. In some cases, the local memory of the node is a local persistent memory. The global memory that resides on a plurality of nodes may have the same characteristics memory, and each node can perform operations on this memory. The global memory can be implemented using any storage device, such as a DIMM, non-volatile memory, volatile memory, and the like. Additionally, nodes can be assigned to particular pieces of the global memory through policies, and the policies may be maintained by each node or the switch that connects the FMCs of the plurality of nodes.

Instead of passing messages through an RMDA, load store semantics are used to communicate between nodes though the FMC. Each FMC implements a fault isolation boundary where even if the CPUs of the node fail, the global memory of each node may be accessed through the FMC. As discussed above, the shared memory may be accessible through a STL networking stack or the PLM link. Each FMC of the plurality of nodes may pass messages between the nodes using load/store semantics, but does not tie up traffic of the plurality of nodes.

The fault isolation boundaries of an FMC may be implemented using various techniques. In some embodiments, hardware is used to ensure that each CPU is independent from other CPUs within the same node and system. In this manner, the failure of independent CPUs does not affect the operation of other CPUs. In other embodiments, the failure of a CPU may cause other CPUs to fail, however, the global memory within the failed node may be powered on and active such that the node can fail without affecting the processing of other nodes, and the memory of the failed node remains accessible.

Figure 2:
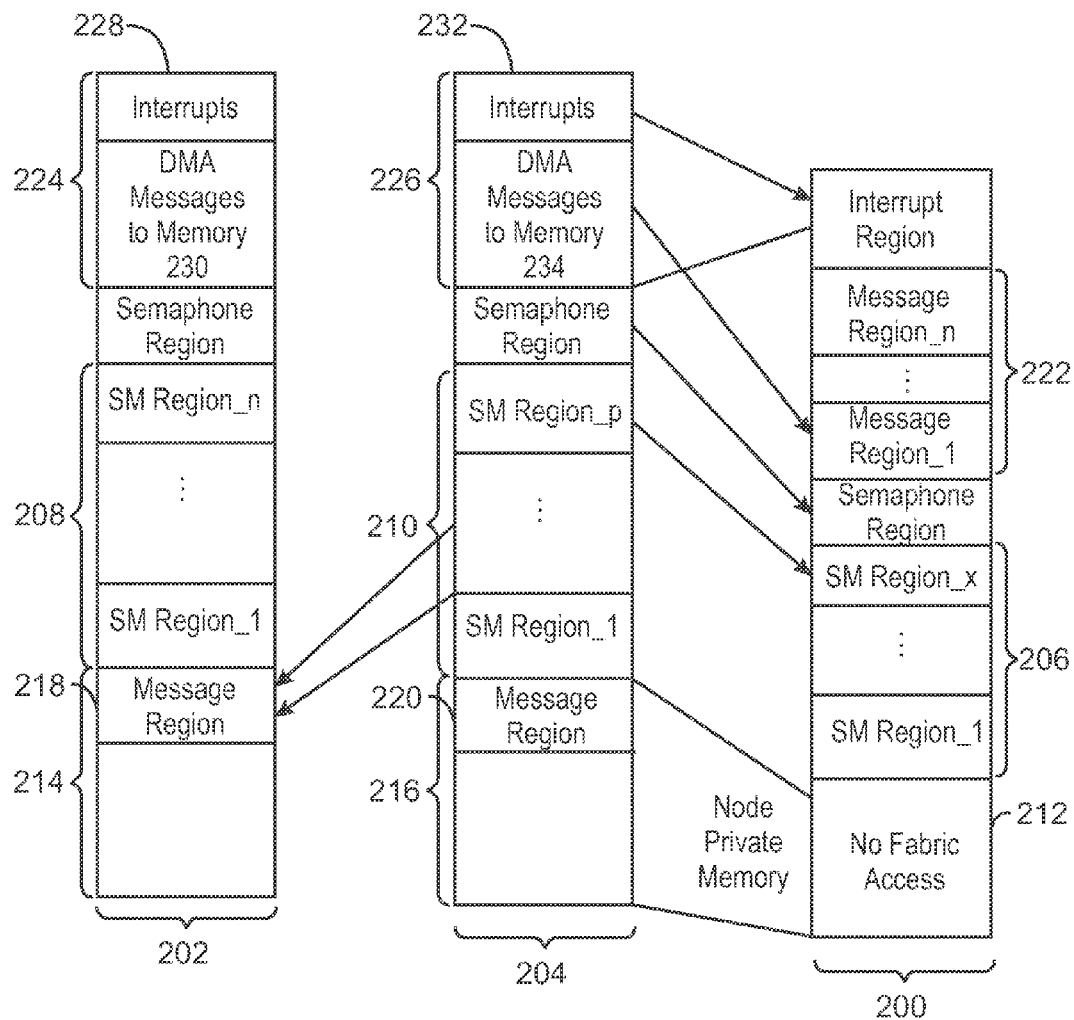
FIG. 2 is an illustration of a global memory map, a node address map, and another node address map.

FIG. 2 is an illustration of a global memory map 200, a node address map 202, and another node address map 204. The global memory map 200 is illustrated as viewed by the one or more FMCs that act as a router or switch to coordinate the access to global memory across the nodes. As discussed above, portions of the global memory may be stored on one or more nodes. Accordingly, a node address map 202 illustrates the memory of a first node while a node address map 204 illustrates the memory of a second node.

The global memory may be divided into multiple shared memory regions 206. The node address map 202 and node address map 204 each include a shared memory region 208 and 210, respectively. The shared memory regions 208 and 210 are mapped by the global memory. As such, the global memory map 200 includes the shared memory region 206. Each node may have different access rights to each shared memory region.

The shared memory region 208 of the node address map 202 may include any number of shared memory regions, ranging from 1 to n. A shared memory region 210 of the node 204 may include another number of shared memory regions, ranging from 1 to p. The shared memory region 206 mapped by the global memory then includes a mapping of the shared memory region 208 ranging from 1 to n, and a mapping of the shared memory region 210 ranging from 1 to p. Each shared memory region may be physically attached to one FMC or may be striped across multiple FMCs. Moreover, the size of the memory regions may be variable or fixed. In embodiments, the each region may be maintained at a page-level granularity, such that an entire memory region can be paged as part of a memory management scheme. As illustrated in FIG. 1, each node may include a local memory that is not accessible by the FMC, and is not represented by the global memory map 200. The global cluster memory map 200 includes a portion 212 that recognizes a local coherent memory region 214 and a local coherent memory region 216 as each individual node's private memory, and is not accessible through the load-store fabric.

The shared memory region 208 and the shared memory region 210 are visible to each of the nodes with the same address range as the global cluster memory map 200. Each shared memory region may have different access rights for each set of nodes. The access rights may be based on a set of policies. Moreover, each shared memory region's address range as well as any access rights are enforced by a set of range registers. In some cases, each shared memory region's address range and access rights may be implemented by a page-table that is resident in the memory if the regions are (super)pages in the FMC(s). The global memory is cacheable in any node, if the node has the appropriate access rights. However, the one or more FMCs that manages the global memory may not enforce a hardware based cache coherence mechanism between the nodes. Instead, the data coherence is enforced by software running on each of the nodes.

The local coherent memory regions 214 and 216 may be used as a message region. Accordingly, each of the local coherent memory regions 214 and 216 include a message region 218 and a message region 220, respectively. While the local message region 218 and the message region 220 are not directly accessible by an FMC acting as a switch or router to share memory across the nodes, the FMC may indirectly access the local message region 218 and the message region 220 through message region 222 as illustrated in the global memory map 200 through direct memory access (DMA) messages passed by each node. In some cases, the DMA messages implement a mailbox mechanism where each node can check its "mailbox" for messages from other nodes.

The message region 218 and the message region 220 can be used to ensure data coherency across the nodes corresponding to node address map 202 and node address map 204. Each node can broadcast a message to the other nodes that have access to a particular portion of memory and request information regarding the status of the particular portion of memory. For example, a first node can request that any node with data belonging to a particular region of memory update that region of memory if it has data belonging to that region of memory. Any node that has that region of memory can respond to the message and inform the requesting first node that the region of memory has been updated and replaced. In some cases, the passing of messages to access the global memory is a software based handshake that is a direct memory access and does not use an I/O stack to access the data.

The global cluster address map 200 enables each node to maintain a private memory region, such as the local coherent memory regions 214 and 216, while enabling a global shared memory region through the shared memory regions 208 and 210. Portions of the global memory may be is used for inter-node communications. There are two distinct types of memory that correspond to the two types of communication mechanisms that can be used for inter-node communications. A reflected memory region can be used for message passing between nodes, while a semaphore memory region can be used to implement semaphore semantics. Both the reflected memory region and the semaphore memory region are backed by physical memory.

The node address map 202 includes a reflected memory region 224, and the node address map 206 includes a reflected memory region 226. Each reflected memory region includes two sub-regions: a message region and an interrupt region. Accordingly, the node address map 202 includes an interrupt region 228 and a message region 230. The node address map 204 includes an interrupt region 232 and a message region 234. Each node maps the reflected memory region into its "uncacheable" space. As presently used, uncacheable space indicates the portion of each node that is not mapped into the global memory. Thus, the node address map 202 maps the reflected memory region 224 into the local coherent memory region 214. Similarly, the node address map 204 maps the reflected memory region 226 into the local coherent memory region 216. In some case, each node writes to its DMA message region using memory write semantics. In some cases, the addresses used when writing to the reflected memory region may be different when compared to the addresses within the local coherent memory region of the destination node. The DMA message region is then mapped into the global memory, and other nodes may access data and messages within the DMA message region of the global memory. In some cases, the DMA message region is available to the nodes on a policy basis. The interrupt region may be used similar to the DMA message regions. However, a write to the interrupt region brings forth immediate attention from the node. The FMC that manages the global memory generates interrupt messages to the one or more destination nodes.

Through the reflected memory region, each node can pass messages or data from its local coherent memory region to other nodes. The reflected memory region can be either unicast or multi-cast, depending on the address range. In a unicast addressing scheme, a write to the message region of the reflected memory region will result in a write to the destination node's private memory region that may be cacheable only in the destination node. In a multicast addressing scheme, a write to the message region of the reflected memory region will result in multiple writes to the destination node's private memory region that may be cacheable only in the destination node. In an embodiment, this write to the reflected memory region may appear in the destination node as a DMA write going through the PCIe hardware stack. In another embodiment, the write to the reflected memory region may go to the destination node using a combination of coherency and memory semantics. Memory semantics may refer to accesses that are addressable in small units, such as a cacheline vs I/O access which is block addressable, typically, 4 KB access per block. Coherency semantics may refer to access that is coherent with respect to the processor caches in that it is always guaranteed to return the latest copy, even if the copy is only resident in a processor cache. This includes coherency semantics that require coherent inter-socket fabric such as Quick Path Interconnect technology, also known as QPI or Keizer Technology Interconnect (KTI), or SMI3. An FMC that manages the global memory may implement one (or more) circular message queue structures in each of the one or more destination nodes so that the FMC appends the message to the appropriate tail pointer of the destination node. The FMC can determine the destination node based on the address range the source node used to perform the write.

The semaphore region can be accessed either using load or store operations to fully use the load store architecture enabled by the data coherency model. The semaphore region is accessible using memory semantics. The semaphore region is not hardware coherent. Rather, the semaphore region enables a hardware assist for a software enforced data coherency mechanism within each node. In some cases, each block of shared memory corresponds to a directory within the semaphore region of memory. Each node has information regarding the address of the directory for each shared block of memory. When a node wants access to a block of data, the node can use the directory within the semaphore region to determine if the node has access to the data. The node may also update the directory for the block of data to indicate that it has the data and the data is protected. Moreover, the directory can inform a node that is has access to the data, but the data is currently in use. In some cases, a DMA message or interrupt can be used to inform the node that the data is available.

Each node may protect shared data through the use of a lock. All shared data can be protected by a lock. In some cases, the locks are managed by a lock manager. A node may update the directory information at the FMC by requesting a lock before accessing shared data. The lock may be an "exclusive" lock to write or update data protected by the lock, or a "shared" lock to read data protected by the lock. If the node is granted an exclusive lock, then the lock manager guarantees that the node is the only node that has a lock on the data within the shared block. If the node has a shared lock, then other nodes may also have shared locks on the data at the particular block, but no node can hold an exclusive lock on that shared block.

The FMC can manipulate meta data corresponding to each semaphore within the semaphore region using certain functions to maintain a history of access to a given portion of this region. The functions may be fixed or programmable. For example, a remote node requests a lock (either shared or exclusive, either read or write) by issuing a read to the semaphore memory address (shared vs exclusive, read vs. write is determined by the lower address bits of the semaphore address being read). The FMC in turn determines whether lock request can be granted, and if so returns the Node ID of the requester back to the node. If the semaphore is already locked, it returns the node ID of the lock owner. Further FMC maintains metadata associated with each semaphore that tracks the queue of lock requesters, type of lock requested by each requester, current owner of the lock and timeout counter.

If the remote node that was requesting the lock was granted the lock, FMC would return the node ID of the requesting node to itself to indicate lock is granted. Other schemes where FMC returns a 0 to indicate lock grant and a 1 to indicate that the lock is owned by some other node are also possible.

The lock owner relinquishes the lock by writing to the semaphore address. The FMC interprets the write and after comparing that the write originated from lock owner, assigns the lock to the next requester. The policy for giving access to the semaphore is a FMC parameter that can be configured. For example, First Come First Served, Round Robin, Weighted Round Robin, and the like are some examples of policies that can be supported by FMC logic.

In some examples, a 32-node system that wants to maintain data coherency on a global shared storage at 512B level granularity (block size). The FMC can implement a 16B "directory" for each shared block. The software running in each node knows the 16B address for each shared block and makes an access accordingly. Bits [33:32] of the 16B address can implement the overall directory information (such as 2'b00 "invalid", 2'b01 "Shared", 2'b010 "Exclusive"). Bits [31:0] of the 16B address may identify which node(s) may have this block (shared or exclusive). Other bits (e.g., bits 58:34 of the 16B address) may contain administrative information, such as a privileged write that may cause the entire directory to be "invalid." An invalid directory may occur, for example, after recovery software cleans up the line following a node failure. Administrative information may also be used to override the directory if the requesting node has ensured that it has taken care of the data coherency through other mechanisms. Moreover, administrative information may include information such as where the priority pointer is located for the next access.

In examples, bits [95:64] of the 16B address may store a queue of requests for the data. If a node wants "shared" access, it may read the 16B address at an offset of 0. For exclusive access, the node may read the 16B address at an offset of 4B, and for administrative access the node may read the 16B address at an offset of 8B. Suppose that a node wants shared access to a block of data. It issues the "read" to offset 0 B. In response to the request for shared access, the FMC reads the 16B directory. If the block is either "invalid" or "shared", the FMC returns a predetermined value indicating success to the requesting node. In some cases, the predetermined value may be all 0s. The FMC then stores the status of that block as "shared" with the requesting node's id bit set in bits [31:0]. If the block is "Exclusive", the FMC can return a "try later" data back to the requesting node. In some cases, the try later data may be all 1 s. Alternatively, the FMC can return the 32-bit vector identifying the node(s) that have the block so that the requestor node can send the message using the mailbox mechanism described by the DMA message region. The node may also use the interrupt region to obtain access to the block. In another alternative, the FMC can send a "flush" request. In some cases, the flush request is sent using the DMA message region of the interrupt region. After the flush request, the FMC can place the requesting node in its "queue." When the block is ready to be shared, the FMC can either send a message or over-write the read-return by issuing a DMA write to the 16 B semaphore region the node had accessed. In this case, each node accesses the semaphore once and then spin on its local cache copy of the semaphore till it gets the proper access right. Note that a node can choose any of these access mechanisms dynamically by providing different address offsets to the FMC. A node can give up ownership of the block by writing to the 16 B directory. The FMC will simply read 16 B directory and then update the directory information bits, if needed, and remove the node from the ownership list it maintains.

Thus, the global memory can include an agreement on which nodes can take and update the data in the global memory, there exists a clustering model of memory with handshaking between the nodes. Additionally, the FMCs can ensure the appropriate access rights for each node, as well as provide access to the data of any node that has died. This access occurs using load/store semantics and hardware, without the delay of an I/O software stack. Moreover, the memory can be accessed like a flat memory, in a linear fashion, per bytes, rather than a block access. In some cases, the shared memory regions are cacheable.

Figure 3:
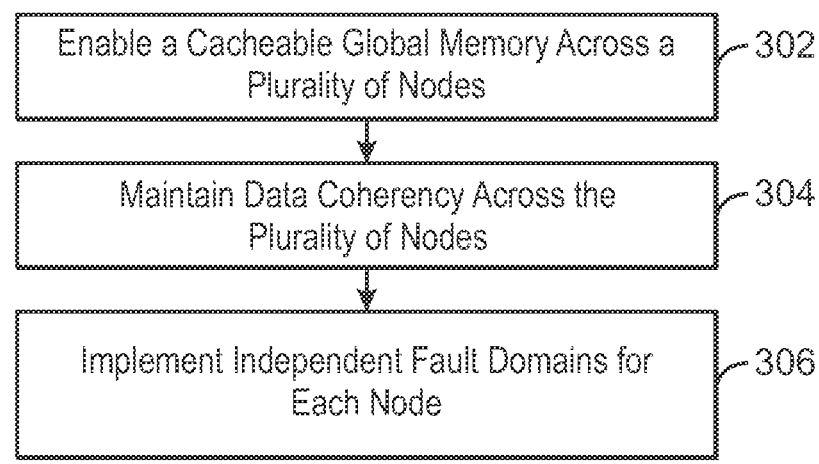
FIG. 3 is a process flow diagram that provides a data coherency model and protocol at cluster level.

FIG. 3 is a process flow diagram 300 that provides a data coherency model and protocol at cluster level. At reference number 302, a cacheable global memory is enabled. In some cases, the global memory is stored across a plurality of nodes. At reference number 304, the data coherency is maintained across the plurality of nodes. In some cases, is data coherency is maintained using software stored on each node of the plurality of nodes and a hardware assist mechanism on a fabric memory controller that connects each node the plurality of nodes. In some cases, the fabric memory controller is integrated as part of a next generation Intel® high performance computing host fabric interface. At reference number 306, independent fault domains are implemented for each node of the plurality of nodes. The independent fault domains may be implemented such that the shared memory on a first node of the plurality of nodes is accessible by other nodes even when the first node has failed.

The present techniques provide a very low-latency mechanism to pass messages between the nodes which can be mapped to the user space. The present techniques also provide a low-latency mechanism to implement semaphores and exchange information even when the underlying processor hardware may not support the semaphore operation to an un-cacheable region. This creates an efficient clustering solution with low-latency message passing and data consistency for shared storage between nodes. Moreover, the present techniques may be used with any high density rack scale architecture (RSA).

EXAMPLE 1

An apparatus for providing data coherency is described herein. The apparatus includes a global persistent memory, a reflected memory region, and a semaphore memory. The global persistent memory is accessed using a protocol that includes input/output (I/O) semantics and memory semantics. The reflected memory region is a portion of the global persistent memory, and each node of a plurality of nodes maps the reflected memory region into a space that is not cacheable. Additionally, the semaphore memory provides a hardware assist for enforced data coherency.

The input/output (I/O) semantics and the memory semantics can be implemented using a Plattsmouth Link. A portion of the global persistent memory may be used for inter-node communication. Additionally, the global memory may include a message region, and a write to the message region of the global memory may result in a write to the destination node's private memory region. The message region may be accessed using memory semantics. Additionally, a directory may be maintained within the semaphore region for each shared block of memory of the global memory. The global memory may be implemented using a DIMM, non-volatile memory, volatile memory, any storage device, and memory device, or any combination thereof. Moreover, the reflected memory region and the semaphore memory region may be backed by physical memory. Also, each node may map the reflected memory region into its uncacheable space.

EXAMPLE 2

A system for providing a data coherency at a cluster level is described herein. The system includes a plurality of nodes, wherein the plurality of nodes include a software coherency mechanism. The system also includes a global shared memory, wherein the global shared memory includes a message region, a semaphore region, and a shared memory region. Further, the system includes one or more fabric memory controllers, wherein the one or more fabric memory controllers connects the plurality of nodes and provides a hardware assist for data coherency at the cluster level.

The fabric memory controller may be a low latency fabric that supports memory load store semantics and an Input/Output protocol with load and store functionality. The fabric memory controller may also be a low latency fabric that supports a Plattsmouth protocol. The fabric memory controller may be integrated as part of host fabric interface of the CPU. Additionally, the fabric memory controller can be integrated as part of an Intel® high performance computing host fabric interface. Moreover, the fabric memory controller can be integrated in to the CPU socket.

The global memory may be implemented using a DIMM, non-volatile memory, volatile memory, any storage device, and memory device, or any combination thereof. The global memory may be implemented using non-volatile memory or storage, where the non-volatile technology is next generation non-volatile technology. The global memory may also be implemented using non-volatile memory or storage where the non-volatile technology is Phase Change Memory and switch (PCMS) devices.

A local memory of each of the plurality of nodes may include a local message region, and the global memory indirectly accesses the local message region through DMA messages passed by each of the plurality of nodes. Additionally, the local message regions may pass messages to access the global memory using a software based handshake that is a direct memory access and does not use an I/O stack to access the data. The semaphore memory region can be used to implement semaphore semantics for inter-node communication. The reflected memory region may be used for message passing between nodes. Further, the reflected memory region may include an interrupt region that is used for inter node communications.

EXAMPLE 3

A method of data coherency at the cluster level is described herein. The method includes enabling a cacheable global memory, wherein the global memory is stored across a plurality of nodes. The method also includes maintaining data coherency across the plurality of nodes. Further, the method includes implementing independent fault domains for each node of the plurality of nodes. Data coherency may be maintained using software stored on each node of the plurality of nodes and a hardware assist mechanism on a fabric memory controller that connects each node the plurality of nodes. Additionally, the independent fault domains may be implemented such that the shared memory on a first node of the plurality of nodes is accessible by other nodes even when the first node has failed.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

For simulations, program code may represent hardware using a hardware description language or another functional description language which essentially provides a model of how designed hardware is expected to perform. Program code may be assembly or machine language, or data that may be compiled and/or interpreted. Furthermore, it is common in the art to speak of software, in one form or another as taking an action or causing a result. Such expressions are merely a shorthand way of stating execution of program code by a processing system which causes a processor to perform an action or produce a result.

Program code may be stored in, for example, volatile and/or non-volatile memory, such as storage devices and/or an associated machine readable or machine accessible medium including solid-state memory, hard-drives, floppy-disks, optical storage, tapes, flash memory, memory sticks, digital video disks, digital versatile discs (DVDs), etc., as well as more exotic mediums such as machine-accessible biological state preserving storage. A machine readable medium may include any tangible mechanism for storing, transmitting, or receiving information in a form readable by a machine, such as antennas, optical fibers, communication interfaces, etc. Program code may be transmitted in the form of packets, serial data, parallel data, etc., and may be used in a compressed or encrypted format.

Program code may be implemented in programs executing on programmable machines such as mobile or stationary computers, personal digital assistants, set top boxes, cellular telephones and pagers, and other electronic devices, each including a processor, volatile and/or non-volatile memory readable by the processor, at least one input device and/or one or more output devices. Program code may be applied to the data entered using the input device to perform the described embodiments and to generate output information. The output information may be applied to one or more output devices. One of ordinary skill in the art may appreciate that embodiments of the disclosed subject matter can be practiced with various computer system configurations, including multiprocessor or multiple-core processor systems, minicomputers, mainframe computers, as well as pervasive or miniature computers or processors that may be embedded into virtually any device. Embodiments of the disclosed subject matter can also be practiced in distributed computing environments where tasks may be performed by remote processing devices that are linked through a communications network.

Although operations may be described as a sequential process, some of the operations may in fact be performed in parallel, concurrently, and/or in a distributed environment, and with program code stored locally and/or remotely for access by single or multi-processor machines. In addition, in some embodiments the order of operations may be rearranged without departing from the spirit of the disclosed subject matter. Program code may be used by or in conjunction with embedded controllers.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus for providing data coherency, comprising:
a global persistent memory, wherein the global persistent memory is accessed using a protocol that includes input/output (I/O) semantics and memory semantics;
a reflected memory region, wherein the reflected memory region is a portion of the global persistent memory, and each node of a plurality of nodes maps the reflected memory region into a space that is not cacheable; and
a semaphore memory, wherein the semaphore memory provides a hardware assist for enforced data coherency.

2. The apparatus of claim 1, wherein the input/output (I/O) semantics and the memory semantics are implemented using a Plattsmouth Link.

3. The apparatus of claim 1, wherein a portion of the global persistent memory is used for inter-node communication.

4. The apparatus of claim 1, wherein the global memory includes a message region, and a write to the message region of the global memory results in a write to the destination node's private memory region.

5. The apparatus of claim 4, wherein the message region is accessed using memory semantics.

6. The apparatus of claim 1, wherein a directory is maintained within the semaphore region for each shared block of memory of the global memory.

7. The apparatus of claim 1, wherein the global memory is implemented using a DIMM, non-volatile memory, volatile memory, any storage device, and memory device, or any combination thereof.

8. The apparatus of claim 1, wherein the reflected memory region and the semaphore memory region are backed by physical memory.

9. The apparatus of claim 1, wherein each node maps the reflected memory region into its uncacheable space.

10. A system for providing a data coherency at a cluster level, comprising:
a plurality of nodes, wherein the plurality of nodes include a software coherency mechanism;
a global shared memory, wherein the global shared memory includes a message region, a semaphore region, a shared memory region; and
one or more fabric memory controllers, wherein the one or more fabric memory controllers connects the plurality of nodes and provides a hardware assist for data coherency at the cluster level.

11. The system of claim 10, wherein the fabric memory controller is a low latency fabric that supports memory load store semantics and an Input/Output protocol with load and store functionality.

12. The system of claim 10, wherein the fabric memory controller is a low latency fabric that supports a Plattsmouth protocol.

13. The system of claim 10, wherein the fabric memory controller is integrated as part of host fabric interface of the CPU.

14. The system of claim 10, wherein the fabric memory controller is integrated as part of Intel® high performance computing host fabric interface.

15. The system of claim 10, wherein the fabric memory controller is integrated in to the CPU socket.

16. The system of claim 10, wherein the global memory is implemented using a DIMM, non-volatile memory, volatile memory, any storage device, and memory device, or any combination thereof.

17. The system of claim 10, wherein the global memory is implemented using non-volatile memory or storage, wherein the non-volatile technology is next generation non-volatile technology.

18. The system of claim 10, wherein the global memory is implemented using non-volatile memory or storage where the non-volatile technology is Phase Change Memory and switch (PCMS) devices.

19. The system of claim 10, wherein a local memory of each of the plurality of nodes includes a local message region, and the global memory indirectly accesses the local message region through DMA messages passed by each of the plurality of nodes.

20. The system of claim 10, wherein the local message regions pass messages to access the global memory using a software based handshake that is a direct memory access and does not use an I/O stack to access the data.

21. The system of claim 10, wherein the semaphore memory region is used to implement semaphore semantics for inter-node communication.

22. The system of claim 10, wherein the reflected memory region is used for message passing between nodes.

23. The system of claim 10, wherein the reflected memory region includes an interrupt region that is used for inter node communications.

24. A method of data coherency at the cluster level, the method comprising:
- enabling a cacheable global memory, wherein the global memory is stored across a plurality of nodes;
- maintaining data coherency across the plurality of nodes; and
- implementing independent fault domains for each node of the plurality of nodes.

25. The method of claim 24, wherein data coherency is maintained using software stored on each node of the plurality of nodes and a hardware assist mechanism on a fabric memory controller that connects each node the plurality of nodes.

26. The method of claim 24, wherein the independent fault domains are implemented such that the shared memory on a first node of the plurality of nodes is accessible by other nodes even when the first node has failed.

* * * * *